US010257941B2

(12) United States Patent
Miyazawa et al.

(10) Patent No.: US 10,257,941 B2
(45) Date of Patent: Apr. 9, 2019

(54) CONNECTION SUBSTRATE

(71) Applicant: NGK Insulators, Ltd., Nagoya, Aichi (JP)

(72) Inventors: Sugio Miyazawa, Kasugai (JP); Tatsuro Takagaki, Nagoya (JP); Akiyoshi Ide, Kasugai (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 16/108,339

(22) Filed: Aug. 22, 2018

(65) Prior Publication Data

US 2018/0359866 A1    Dec. 13, 2018

Related U.S. Application Data

(63) Continuation of application No. PCT/JP2017/003554, filed on Feb. 1, 2017.

(51) Int. Cl.
| H05K 1/11 | (2006.01) |
| H05K 3/40 | (2006.01) |
| H05K 3/26 | (2006.01) |
| H01L 23/15 | (2006.01) |

(52) U.S. Cl.
CPC ........... *H05K 3/4061* (2013.01); *H01L 23/15* (2013.01); *H05K 3/26* (2013.01)

(58) Field of Classification Search
CPC .............. H05K 3/4038; H05K 1/115; H05K 2201/095; H05K 2201/09563
See application file for complete search history.

(56) References Cited

U.S. PATENT DOCUMENTS

| 5,614,043 A | 3/1997 | Ritland et al. |
| 5,922,245 A | 7/1999 | Mohri et al. |
| (Continued) | | |

FOREIGN PATENT DOCUMENTS

| JP | 62-296496 A | 12/1987 |
| JP | 06-291435 A | 10/1994 |
| (Continued) | | |

OTHER PUBLICATIONS

International Preliminary Report on Patentability for PCT/JP2017/003554, dated Sep. 11, 2018 (1 pg.).

(Continued)

*Primary Examiner* — Hoa C Nguyen
(74) *Attorney, Agent, or Firm* — Flynn Thiel, P.C.

(57) ABSTRACT

A connection substrate includes a ceramic substrate with a through hole therein and a through conductor provided in the through hole and having first main surface and a second main surface. The through conductor includes a metal porous body having first open pores communicating with the first main surface, and second open pores communication with the second main surface, first glass phases provided in the first open pores, respectively, second glass phases formed in the second open pores, respectively, first spaces provided in the first open pores, respectively, and second spaces provided in the second open pores, respectively. The first spaces are closed spaces which do not communicate with the first main surface. The second spaces are open spaces communicating with the second main surface.

4 Claims, 8 Drawing Sheets

(56) References Cited

U.S. PATENT DOCUMENTS

| | | | |
|---|---|---|---|
| 6,093,476 A * | 7/2000 | Horiuchi | H01L 21/486 174/255 |
| 9,161,450 B2 | 10/2015 | Kamakura | |
| 9,282,638 B2 | 3/2016 | Bonkohara et al. | |
| 9,403,023 B2 * | 8/2016 | Markham | A61N 1/3754 |
| 9,954,160 B2 | 4/2018 | Ishigami et al. | |
| 2009/0114338 A1 * | 5/2009 | Kawakita | H05K 3/4069 156/249 |
| 2010/0096178 A1 | 4/2010 | Kim et al. | |
| 2010/0193952 A1 * | 8/2010 | Arana | H01L 21/2885 257/746 |
| 2011/0095433 A1 * | 4/2011 | Horiuchi | H01L 24/00 257/773 |
| 2011/0175235 A1 * | 7/2011 | Horiuchi | H01L 23/49811 257/774 |
| 2013/0186675 A1 * | 7/2013 | Takahashi | H05K 1/0306 174/253 |
| 2015/0351241 A1 | 12/2015 | Hirose et al. | |
| 2015/0357254 A1 | 12/2015 | Mikami | |

FOREIGN PATENT DOCUMENTS

| | | |
|---|---|---|
| JP | 09-046013 A | 2/1997 |
| JP | 2003-101181 A | 4/2003 |
| JP | 2005-063708 A | 3/2005 |
| JP | 2005-093105 A | 4/2005 |
| JP | 4154913 B2 | 9/2008 |
| JP | 2010-098291 A | 4/2010 |
| JP | 2011-176033 A | 9/2011 |
| JP | 2012-114213 A | 6/2012 |
| JP | 2013-165265 A | 8/2013 |
| JP | 2013-219253 A | 10/2013 |
| JP | 2015-065442 A | 4/2015 |
| JP | 2015-119165 A | 6/2015 |
| JP | 5820092 B1 | 10/2015 |
| JP | 2015-231009 A | 12/2015 |
| JP | 2016-004973 A | 1/2016 |
| WO | WO 2014/106925 A1 | 7/2014 |
| WO | WO 2015/141344 A1 | 9/2015 |

OTHER PUBLICATIONS

English translation of Written Opinion of the International Searching Authority for PCT/JP2017/003554, dated Apr. 11, 2017 (5 pgs.).
International Search Report for PCT/JP2017/003554 (2 pgs).

* cited by examiner

CONNECTION SUBSTRATE

CROSS-REFERENCE TO RELATED APPLICATIONS

This is a continuation of International Application No. PCT/JP2017/003554, filed Feb. 1, 2017, which claims priority of Japanese Patent Application No. 2016-048165, filed Mar. 11, 2016, the entire contents of which are incorporated herein by reference.

TECHNICAL FIELD

The present invention relates to an electrical connection substrate in which a through conductor, such as a via conductor, is formed in a through hole.

RELATED ART STATEMENT

As a substrate for mounting an electronic device such as a SAW filter, it is used a substrate (via substrate) having the structure that a through hole is provided in an insulating substrate such as ceramic substrate and the through hole is filled with a conductor to provide a through electrode. Recently, as the reduction of size of a communication apparatus represented by cellular phone, it is demanded miniaturization and reduction of height to an electronic device used therein. It is further demanded the reduction of the substrate thickness for the via substrate constituting the device.

Further, for attaining the miniaturization, it is necessary to make wirings on a surface of the substrate fine. It is thereby demanded that the size of the through electrode is made smaller and the precision of the position is made finer. Further, as the fine wirings are formed by photolithography or plating, for preventing failure due to invasion of liquid chemical during the step of applying a resist or plating, it is particularly demanded that the through electrode is dense and its water-tightness is high.

It is proposed various kinds of solutions are proposed for densifying the through electrode. The solutions, however, aim at relatively thick substrates and through electrode of a large size. Desired results are not obtained in the case that a thin substrate and a through electrode of a small size are used.

For example, according to patent document 1, it is disclosed the method of forming a conductive protection film on a surface of a porous through electrode for preventing the invasion of resist liquid. In the case that the thickness of an insulating substrate is thin, permeability of the through hole is high and the strength of the conductive protection film is insufficient so that it does not function as a protection film. Further, separation tends to occur along an interface of ceramics and metal due to difference of thermal expansion.

According to the method of patent document 2, after a porous first conductor is formed as a through electrode, its pores are filled with a second conductor. In the case that a ceramic substrate is used, however, due to a difference of thermal expansion of a metal as a conductor and ceramics, cracks or warpage of the substrate tends to occur after the substrate is thinned.

According to patent document 3, it is disclosed the method that metals containing an active metal are filled in a through hole of a ceramic substrate to form an active metal layer between the ceramic substrate and through electrode and to densify the active metal layer. However, in addition to the problem of generation of cracks due to the difference of thermal expansion of ceramic and metal as described above, the viscosity of a metal solder containing the active metal is very high. It is thereby difficult to fill it well in the case that the size of the through electrode is small.

According to the method disclosed in patent document 4, it is used a conductive paste containing an expansion agent in forming a through electrode. It is, however, difficult to fill all the cavities only with the expansion agent. Particularly in the case that it is thinned, the through electrode cannot be densified.

According to patent document 5, it is disclosed the method of positioning powdery conductive material in through holes of a ceramic substrate, respectively, and of filling glass paste therein. However, cracks or warping due to a difference of thermal expansions of ceramic and the powdery conductive material tends to occur. Further, as the through hole is smaller, it becomes difficult to position the powdery conductive material.

RELATED DOCUMENTS

Patent Documents (Patent document 1) Japanese Patent No. 4154913B
(Patent document 2) Japanese Patent Publication No. 2013-165265A
(Patent document 3) Japanese Patent publication No. 2015-065442A
(Patent document 4) Japanese Patent Publication No. H09-046013A
(Patent document 5) Japanese Patent Publication No. 2015-119165A

SUMMARY OF THE INVENTION

An object of the present invention is, in producing a connection substrate having a ceramic substrate and a through conductor formed in a through hole, to improve water-tightness of the through hole.

The present invention provides a connection substrate comprising a ceramic substrate comprising a through hole therein, and a through conductor formed in the through hole and having a first main surface and a second main surface. Further, the through conductor includes a metal porous body including first open pores communicating with the first main surface, and second open pores communicating with the second main surface, a first glass phase provided in the first open pores, a second glass phase formed in the second open pores, first spaces provided in the first open pores and second spaces provided in the second open pores. The first spaces are closed spaces which do not communicate with the first main surface, and the second spaces are open spaces communicating with the second main surfaces.

Effects of the Invention

The inventors have reached the following findings in the course of studying water-tightness of the through conductor. That is, according to prior arts, a metal paste is supplied into a through hole of a ceramic substrate and then fired to obtain a through conductor. Such through conductor has the microstructure which is uniform as a whole. As the thickness of the ceramic substrate becomes extremely small, a part of open pores is communicated between both main surfaces of the through conductor, resulting in leakage of a trace amount of liquid.

Then, the inventors studied to reduce a number of pores in the metal porous body forming the through conductor. As the number of the pores of the metal porous body is small, separation at an interface between the through conductor and ceramic tends to occur due to the difference of the thermal expansions, resulting in deterioration of the water-tightness of the separated parts at which the separation occurs.

Then, the inventors focused on the microstructure of the metal porous body mainly forming the through conductor. The metal porous body includes a first open pores communicating with the first main surface and second open pores communicating with the second main surface.

Then, for preventing the separation due to the difference of thermal expansions between the through conductor and ceramics, the inventors reached the idea of generating glass phases in the respective open pores and of clogging the spaces by the glass phases in the first open pores communicating with the first main surface, so that the first open pores in the through conductor mainly provide water-tightness of the through conductor. At the same time, on the side of the second open pores communicating with the second main surface, the spaces are not clogged with the glass phase and the spaces are communicated with the second open pores. It is thus possible to preserve the water-tightness of the through conductor itself and to avoid the separation of the through conductor and ceramics as a whole, resulting in the preservation of the water-tightness also in this respect.

EMBODIMENTS FOR CARRYING OUT THE INVENTION

The present invention will be described further in detail, appropriately referring to drawings.

It will be described an example of a method of producing a ceramic substrate of the present invention first.

Figure 1A:
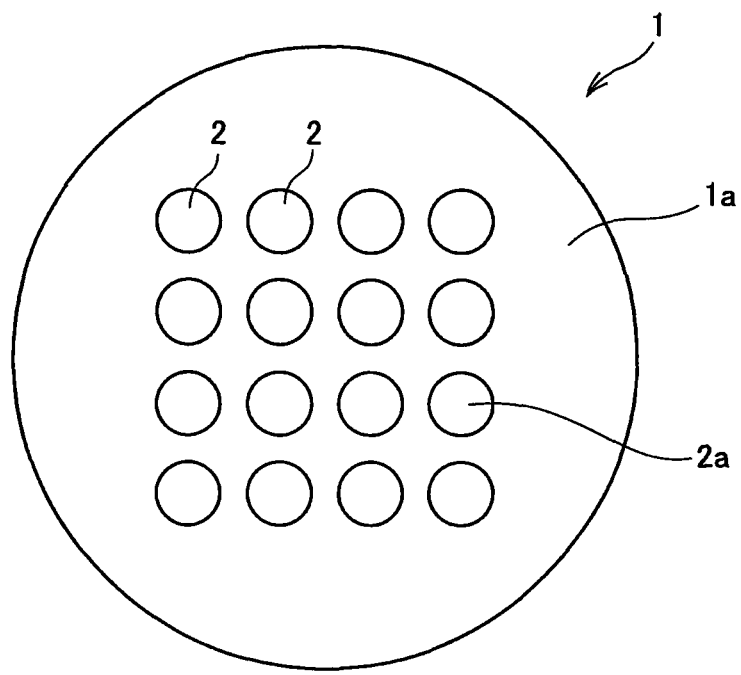
FIG. 1(*a*) is a plan view schematically showing a ceramic substrate 1 with through holes arranged therein, and FIG. 1(*b*) is a cross sectional view showing the ceramic substrate 1.
Figure 1B:
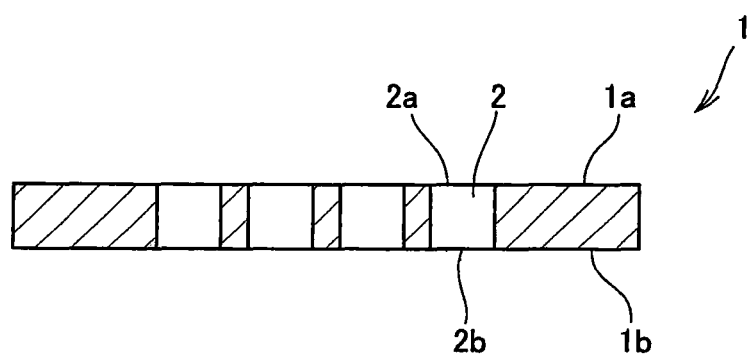
Figure 2A:
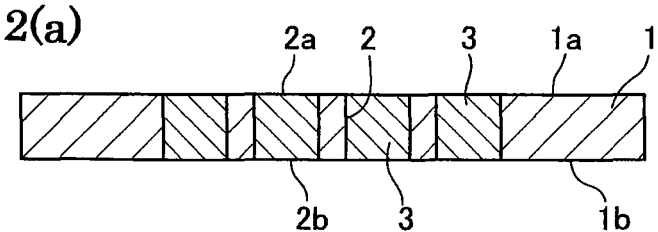
FIG. 2(*a*) shows the state that metal paste 3 is filled in the through holes of the ceramic substrate 1, FIG. 2(*b*) shows the state that the metal paste 3 is fired to form a metal porous body 4, FIG. 2(*c*) shows the state that a glass layer 9 is formed on a first main surface 1*a* of the ceramic substrate 1, and FIG. 2(*d*) shows the state that the glass layer 9 is removed.
Figure 2B:
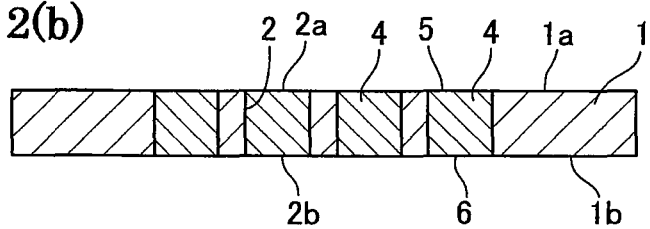
Figure 2C:
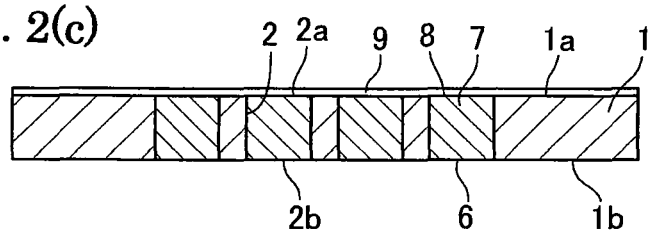
Figure 2D:
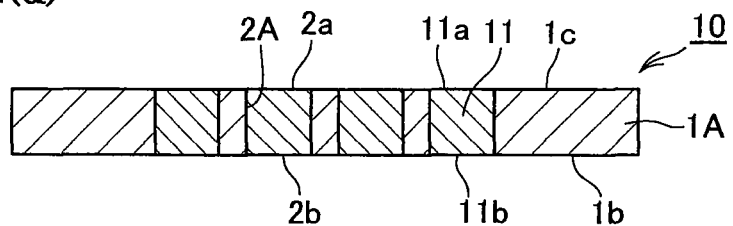

As shown in FIG. 1, a first main surface 1*a* and a second main surface 1*b* are provided in a ceramic substrate 1, and it is formed many through holes penetrating through the main faces 1*a* and 1*b*. Openings 2*a* and 2*b* are provided on the sides of the first main surface 1*a* and second main surface 1*b*, respectively, in the through hole 2.

Then, as shown in FIG. 2(*a*), a metal paste 3 is filled in the opening 2 of the ceramic substrate 1. Then, the metal paste 3 is heated to fire the metal paste to generate a metal porous body 4 in the through hole 2, as shown in FIG. 2(*b*). 5 represents a first main surface of the metal porous body 4, and 6 represents a second main surface of the metal porous body 4.

Then, a glass paste is applied on the first main surface 1*a* of the ceramic substrate 1 to form a glass paste layer. At this state, the glass paste is heated and fired to melt glass therein. By this, as shown in FIG. 2(*c*), a glass layer 9 is formed on the first main face 1*a* of the ceramic substrate 1. At the same time, the molten glass is impregnated into open pores of the metal porous body to form glass phases to thereby form a through conductor 7 in the through hole. Further, 8 represents a first main surface of the through conductor 7.

The glass layer 9 is then removed so that the through conductor is exposed to the side of the first main surface of the ceramic substrate to provide a connection substrate. At this time, preferably, the first main surface 1*a* of the ceramic substrate 1 is further polished to form a polished surface 1*c*, so that a connection substrate 10 is obtained, as shown in FIG. 2(*d*).

Figure 3A:
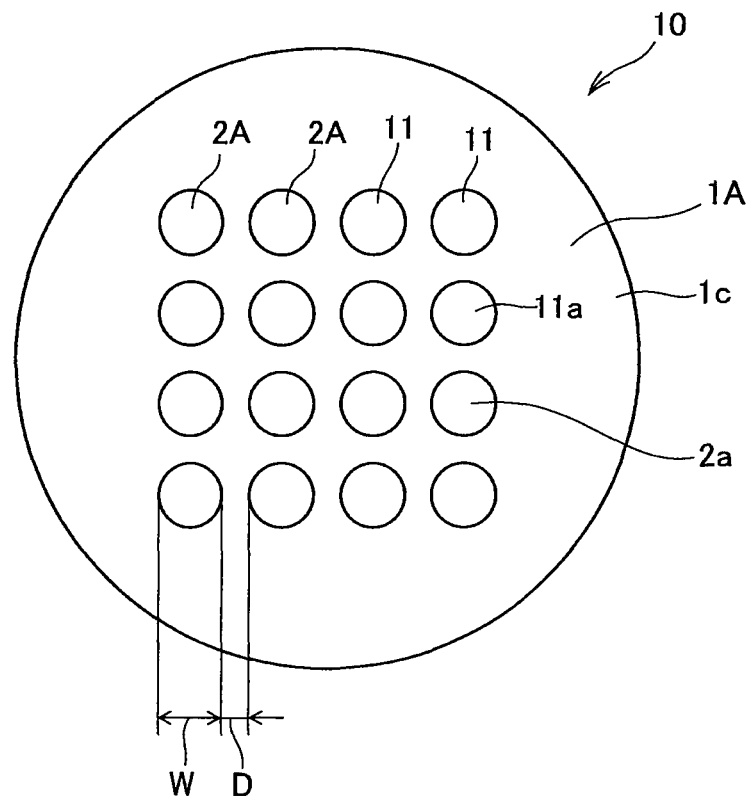
FIG. 3(*a*) is a plan view schematically showing a connection substrate 10 with through conductors 11 formed in through holes 2A, and FIG. 3(*b*) is a cross sectional view showing the connection substrate 10.
Figure 3B:
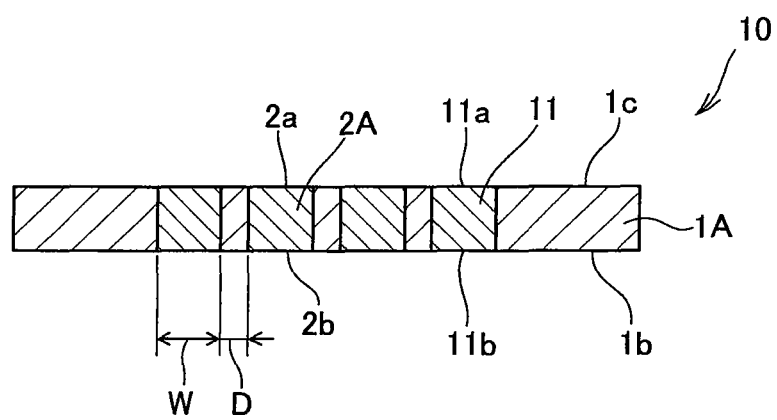

As shown in FIG. 2(*d*) and FIGS. 3(*a*) and (*b*), in a ceramic substrate 1A of the connection substrate 10, the through conductor 11 is filled in each of the through holes 2A. 11*a* represents a first main surface of the through conductor 11, and 1*ib* represents a second main surface of the through conductor 11.

As shown in FIG. 2(*b*), the metal paste is fired to form the metal porous body 4 in the through hole 2. According to the present example, the metal porous body 4 extends from the first main surface 1*a* to the second main surface 1*b* of the ceramic substrate 1. 5 represents a first main surface and 6 represent a second main surface of the metal porous body.

Figure 4:
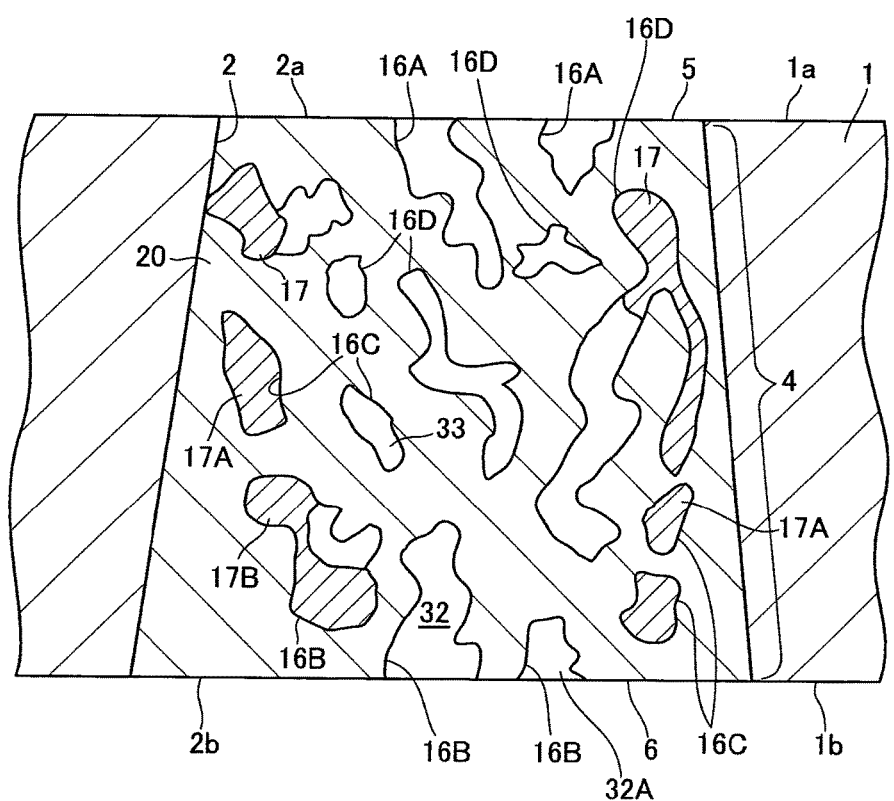
FIG. 4 is a schematic view showing structure of a metal porous body 4 formed in the through hole.

As shown in FIG. 4, the metal porous body 4 is composed of a metal matrix 20 having pores 16A, 16B, 16C and 16D. Besides, in the case that a glass component is added into the metal paste, a part of the pores is filled with glass phases 17, 17A and 17B. The pores generated in the matrix include first open pores 16A and 16D opening at the first main surface 5, second open pores 16B opening at the second main surface 6, and closed pores 16C which is not opened at the main surfaces 5 and 6. Further, the open pores 16A is opened at the first main surface 5 on the cross section of FIG. 4. On the contrary, the open pores 16D is not opened at the first main face 5 on the cross section of FIG. 4 and opened at the first main surface 5 through routes not shown in the cross section. The open pores 16A and 16D are thus distinguished.

According to the state shown in FIG. 4, a part of each of the open pores 16A, 16B, 16C and 16D is filled with the glass phase 17, 17A or 17B and the remaining parts are left as the spaces. A space 33 is a closed space which does not communicate with the main surfaces, and a space 32 is a opened space opening at the second main surface 6.

Then, in the case that the ceramic substrate is subjected to a water-tightness, the leakage of water may be observed from the first main surface 1*a* to the second main surface 1*b*. The reasons are considered as follows. It is speculated that the first open pores 16A, 16D communicating with the first main surface 5 and the second open pores 16B communicating with the second main surface are partly communicated with each other.

Figure 5:
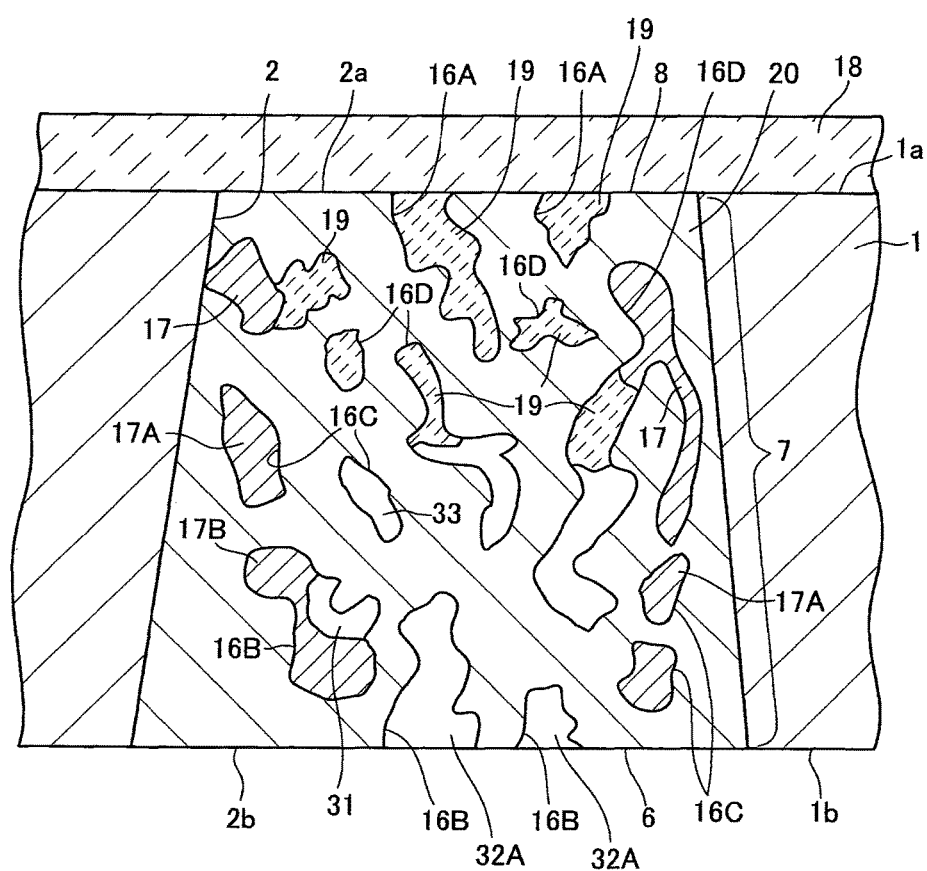
FIG. 5 is a schematic view showing a glass phase 19 impregnated into through holes 16A of the metal porous body 4 and a glass layer 18 formed on the first main surface 1*a* of the ceramic substrate 1.

On the contrary, as shown in FIG. 5, a glass paste is applied so that the open pores 16A and 16D opening at the first main surface 5 are covered by it. At this state, the glass paste is fired so that a glass layer 18 is formed on the first main surface 1a and, at the same time, the molten glass is impregnated into the open pores 16A and 16D to form the glass phases 19 therein. In a part of the open pores, it may be co-exist glass phases 17 originally included in the metal porous body and glass phases 19 generated by the impregnation and firing of the glass paste.

Then, by impregnating the molten glass from the side of the first main surface to the open pores 16A and 16B of the metal porous body, at least a part on the side of the first main surface of the first open pores is clogged with the glass phases 19. As a result, it is not left open pores communicating with the first main surface 8 and second main surface 6, so that the water-tightness can be considerably improved.

Figure 6:
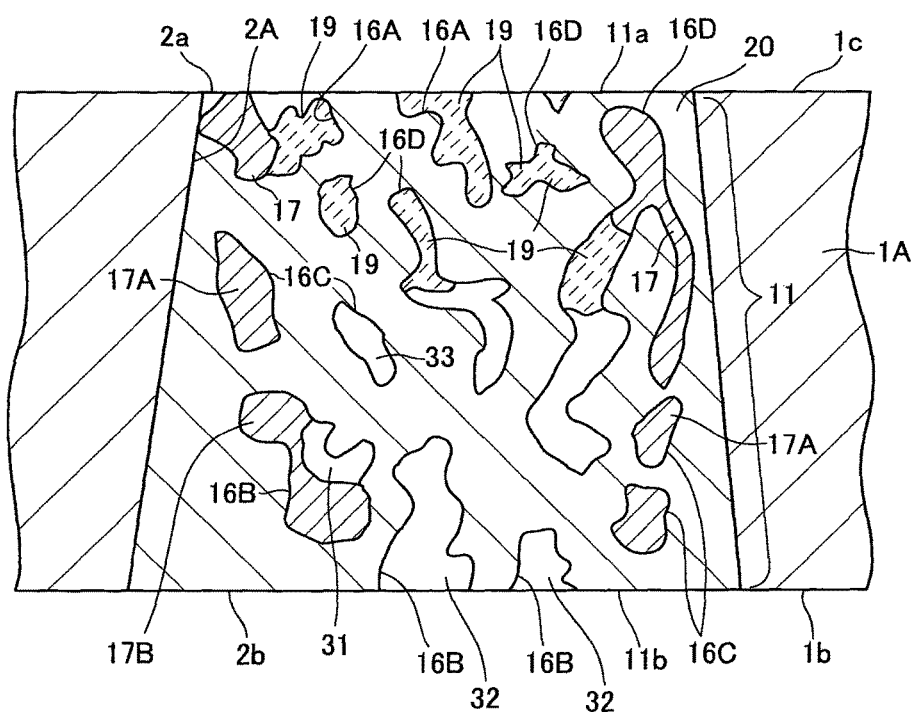
FIG. 6 is a schematic view showing structure of the through conductor 11 after the glass layer is removed.

In the state shown in FIG. 5, however, as the metal porous body is covered by the glass layer 18, both sides of the ceramic substrate 1 cannot be electrically conductive by the through conductor 7. Thus, the unnecessary glass layer 18 is removed as shown in FIG. 6, so that the through conductor is exposed to the side of the first main surface. At this time, the first main surface of the ceramic substrate may preferably be subjected to polishing to form a polished surface, so that the through conductor can be further assuredly exposed and the exposed surface can be made flat.

At this state, as shown in FIG. 6, a polished surface 1c is formed in a ceramic substrate 1A and the thickness of the ceramic substrate 1A is made smaller than that before the polishing. Further, the through conductor 11 is formed in the through hole 2A.

Here, as the through conductor having the shape shown in FIG. 6 is further analyzed, the followings are found. The mechanism of exhibiting the water-tightness will be described below referring to FIG. 7.

Figure 7:
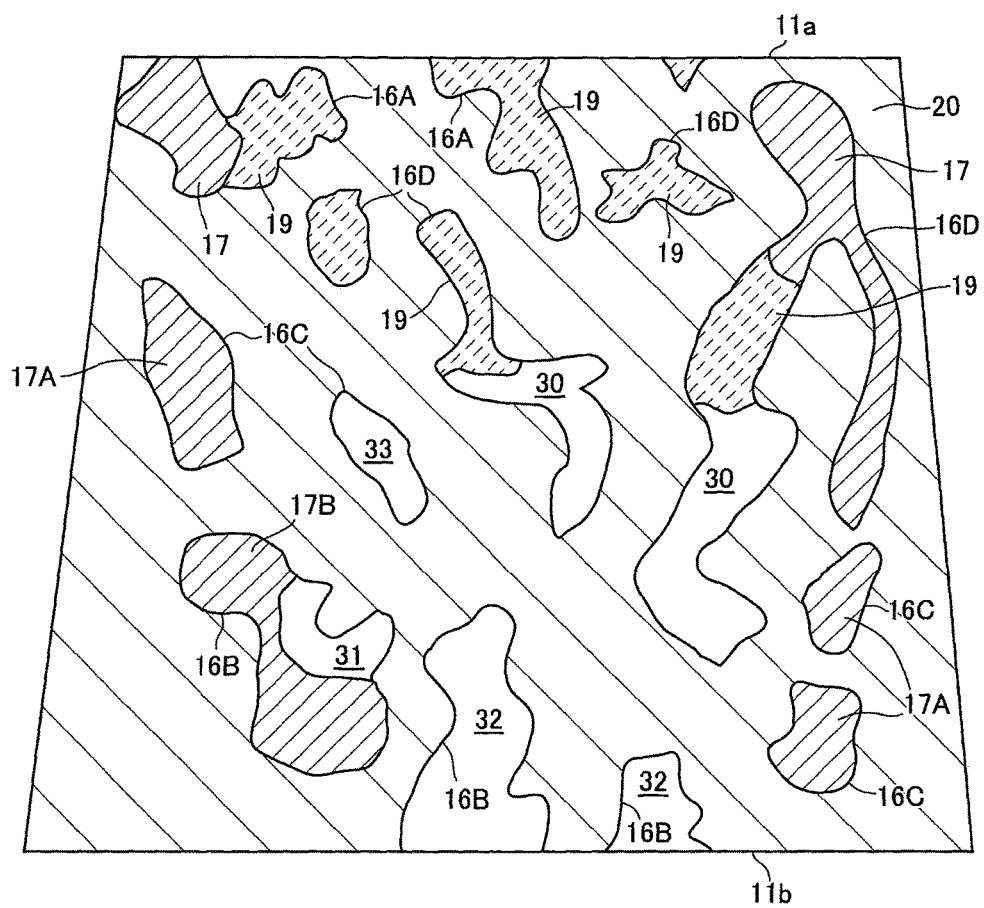
FIG. 7 is an enlarged view for illustrating the microstructure of the through conductor.

In FIG. 7, the first open pores 16A and 16D are communicated with the first main surface 11a of the through conductor. Further, the second open pores 16B are communicated with the second main surface lib. 16C represents open pores which are not communicated with both of the main surfaces 16A and 16B. In the first open pores 16A and 16D, glass phases 17 derived from the metal paste, glass phases 19 derived from the glass impregnated afterward and spaces 30 which do not open at the main surface 11a are left. Further, in the open pores 16C, the glass phases 17A derived from the metal paste and spaces 33 which do not open at the main surfaces are left. Further. in the second open pores 16B communicating with the second main surface 11b, the glass phases 17B derived from the metal paste, spaces 32 communicating with the main surface 11b and spaces 31 which do not open at the main surfaces 11a and 11b are left.

Then, the first spaces 30 left in the first open pores 16A and 16B are clogged by the glass phases 17 and 19 to provide closed spaces which do not communicate with the first main surface 11b. It is thus possible to prevent the leakage of liquid through the first and second open pores between the main surfaces. At the same time, the second spaces 32 in the second open pores provide open spaces communicating with the second main surface 11b. By leaving such spaces communicating with the main surface, it is possible to relax a stress between the ceramic and through conductor and to prevent the leakage of liquid due to separation of the through conductor from the ceramic.

Further, according to the examples described above, the glass molten from the first main surface of the through conductor is impregnated to generate the glass phases in the first open pores, so that the first spaces are refrained from communicating with the first main surface. However, the present invention is not to be limited to this production method. For example, in the case that the metal paste is filled in the through hole, the compositions of the metal pastes can be changed in the upper and lower halves of the through hole, so that it can be produced a though conductor having the microstructure of the present invention.

The constituents of the present invention will be described further below.

According to a preferred embodiment, in the cross section of the through conductor, a ratio of an area of the metal porous body is 30 to 70 percent. In the case that the ratio of the area of the metal porous body is too high, the thermal stress between the through conductor and ceramic is increased. In the case that the ratio of the area is too low, the conductivity becomes low. On the viewpoint, the ratio of the area of the metal porous body is made 30 to 70 percent, and it may preferably be 40 to 65 percent and more preferably be 45 to 60 percent.

According to a preferred embodiment, in the cross section of the through conductor, the ratio (total value) of areas of the glass phases is 10 to 50 percent and more preferably 20 to 40 percent.

Further, according to a preferred embodiment, in the cross section of the through conductor, a total value of the ratios of the areas of the spaces may preferably be 5 to 60 percent and more preferably be 5 to 40 percent.

The ratios of the areas of the metal porous body, glass and spaces are measured by taking an SEM photograph image (1000 folds) of the cross section of the through conductor. By changing color tones by SEM for the respective materials, it is possible to distinguish the respective materials. Thereafter, the conductor part to be measured is divided into lattices each having a size of 5 μm for each side, and it is decided the material occupying the largest area in each of the lattices. The numbers of the lattices with the material decided are compared so that the area ratios can be calculated.

According to a preferred embodiment, the thickness of the ceramic substrate is 25 to 150 μm and the diameter W of the through hole is 20 to 60 μm. The present invention is particularly useful for such thin and small connection substrates.

The diameter W of the through hole formed in the ceramic substrate may more preferably be 25 μm or larger on the viewpoint of ease of molding. A distance D of the adjacent through holes (distance between through holes which are nearest to each other) may preferably be 50 μm or larger and more preferably be 100 μm or larger on the viewpoint of preventing fracture or cracks. Further, the distance D between the adjacent through holes 2 may preferably be 1000 μm or smaller and more preferably be 500 μm or smaller, on the viewpoint of improving the density of the through holes.

The method of forming the through holes in the ceramic substrate is not particularly limited. For example, the through holes may be formed by subjecting a green sheet of the ceramic substrate to processing by laser or a pin. Alternatively, a blank substrate made of a ceramic material is produced, and the through holes may be formed by laser processing in the blank substrate. As a laser oscillating source, $CO_2$, YAG (yttrium aluminum garnet) etc. may be used.

As the ceramic material forming the ceramic substrate, aluminum oxide, yttrium oxide, YAG, zirconium oxide, and aluminum nitride are listed. Among them, aluminum oxide, particularly aluminum oxide having a high purity of 99.9 percent or higher is useful, as it has a Young's modulus as high as 400 GPa or higher, so that the stability of shape is excellent after the thinning.

According to the present invention, the metal paste is supplied into the through hole and heated to generate the metal porous body. As a metal mainly constituting the metal paste, Ag, Au, Cu, Pd or the mixtures thereof is listed. Further, a glass component may be added to the metal to generate a paste. Such glass component includes $B_2O_3$, $SiO_2$, ZnO, PbO, $Li_2O$, $Na_2O$, $K_2O$, MgO, CaO, SrO, BaO, $Bi_2O_3$, $Al_2O_3$, $Gd_2O_3$, $Y_2O_3$, $La_2O_3$, $Yb_2O_3$, $TeO_2$, $V_2O_5$ and $P_2O_5$.

Although the temperature of firing of the metal paste is appropriately selected depending on the kind of the paste, it may be 500 to 900° C., for example.

Next, the glass paste is applied on the first main surface of the metal porous body and the glass paste is impregnated into the open pores of the metal porous body. At this time, the glass paste may be applied over the whole of the first main surface of the ceramic substrate. Alternatively, the glass paste may be applied only on the first main surface of the metal porous body and the glass paste may not be applied on the remaining part of the surface of the ceramic substrate, by means of screen printing or the like.

The glass paste is then molten by heating, so that the glass layer is formed on the main surface of the metal porous body and the molten glass is impregnated into the open pores to form the glass phases. Although the temperature of firing of the glass paste is selected depending on the kind of the paste, it may be 500 to 900° C., for example.

Then, at least the glass layer on the metal porous body is removed to obtain a connection substrate having the ceramic substrate and through conductors provided in the through holes. At this state, although it is sufficient that at least the glass layer is removed to expose the through conductor, the first main surface of the ceramic substrate is preferably polished. Then, predetermined wirings, pads or the like are formed on each of the main surfaces 11a and 11a of the ceramic substrate. Further, the ceramic substrate is made an integrated relay board.

The ceramic substrate is preferably subjected to precise polishing. As such precise polishing, CMP (Chemical Mechanical Polishing) is generally used. As polishing slurry for CMP, it is used slurry including an alkaline or neutral solution with abrasives having a particle size of 30 nm to 200 nm dispersed. As the materials of the abrasives, silica, alumina, diamond. zirconia and ceria are listed and may be used alone or in combination. Further, as the polishing pad, hard urethane pad, non-woven pad or suedo pad is listed.

EXAMPLES

Example 1

Connection substrates were produced as described referring to FIGS. 1 to 6.

Specifically, it was produced slurry by mixing the following components.
(Powdery Raw Material)

| (Powdery raw material) | |
|---|---|
| α-alumina powder having a specific surface area of 3.5 to 4.5 m²/g and an average primary particle size of 0.35 to 0.45 μm (alumina purity of 99.99 percent) | 100 weight parts |

| -continued | |
|---|---|
| MgO (magnesia) | 250 ppm |
| $ZrO_2$ (zirconia) | 400 ppm |
| $Y_2O_3$ (yttria) | 15 ppm |
| (Dispersing medium) | |
| 2-ethyl hexanol | 45 weight parts |
| (Binder) | |
| PVB (polyvinyl butyral) resin | 4 weight parts |
| (Dispersing agent) | |
| High molecular surfactant | 3 weight percent |
| (Plasticizer) | |
| DOP | 0.1 weight parts |

The slurry was then shaped into a tape by doctor blade method to a thickness corresponding with the thickness after the sintering of 300 μm, and the tape was cut into square pieces each having sizes corresponding with a length of 100 mm and a width of 100 mm after the sintering. The thus obtained powder-shaped body was calcined (preliminary sintering) in atmosphere at 1240° C. The calcined body was then mounted on a plate made of molybdenum and then sintered by holding under an atmosphere of hydrogen 3: nitrogen 1 at a temperature elevation rate of 50° C./h from 1300° C. to 1550° C. and a holding time of 2.5 hours at 1550° C., providing a blank substrate.

The blank substrate was subjected to laser processing under the following condition to form through holes having the following dimensions.

| $CO_2$ laser: Wavelength | 10.6 μm |
|---|---|
| Pulse: 1000 Hz- On time | 5 μs |
| Laser mask size: | 0.9 mm |
| Number of shots: | 40 counts |
| Size W of through hole: | Upper surface 0.06 mm |
| | Bottom surface 0.02 mm |
| Distance D of through hole: | 0.12 mm |
| Number of through holes: | 30000 counts/unit |

Then, during the laser processing, droth attached onto the substrate surface was removed by grinding with a grinder, and the substrate was then subjected to annealing under atmosphere at 1300° C. for 5 hours to obtain a ceramic substrate having a thickness of 200 μm.

Then, embedded printing of Ag—Pd paste was performed in the through holes of the ceramic substrate under the following condition, and the paste was dried and then fired to provide through conductors.
(Ag—Pd Paste)
  Concentration of solid content: 95 weight percent
  Composition of solid content:
  Ag:Pd:glass frit=91:3:6 (weight ratio)
  Viscosity: 200 Pa·s
(Printing Condition)
  Mask: not used (paste is directly mounted on the substrate and a squeegee is used to press the paste into the through holes)
  Angle of squeegee: 20°
  Speed of squeegee: 5 mm/sec
  Number of squeegee: 10 counts
(Drying Condition)
  95° C.×30 minutes
(Sintering Condition)
  600° C.×40 minutes The glass paste was applied on a first surface of the substrate so that the through holes were covered, fired and molten under the following conditions so that glass was impregnated into the pores inside of the conductor.
(Glass Paste)
  Concentration of solid content: 95 weight percent
  Glass composition: Bi—Zn—B series
  Viscosity: 50 Pa·s
(Printing Condition)
  Mask: #360 mesh, 30 μm thickness
  Squeegee angle: 70°
  Squeegee speed: 5 mm/sec
  Number of squeegee: 1 count
(Drying Condition)
  95° C.×30 minutes
(Melting and Impregnating Condition)
  570° C.×3 hours The glass layer remaining on the surface was then removed by polishing to obtain a connection substrate. Specifically, the substrate was subjected to grinding by a grinder with the substrate adhered onto an alumina paste. Both surfaces of the substrate were subjected to lapping with diamond slurry. The grain size of the diamond was made 3 μm. It was finally performed CMP processing by $SiO_2$ and diamond abrasives. Thereafter, the substrate was separated from the alumina plate, the processing as described above was performed on the main surface on the opposite side, and cleaning was performed to obtain the connection substrate.

Figure 8:
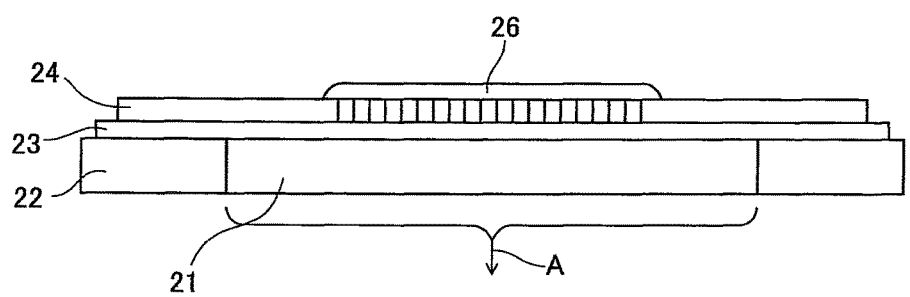
FIG. 8 is a schematic view for illustrating a method of testing water-tightness.

As to the thus obtained connection substrate, the cross section of the through conductor was observed. As a result, as shown in a schematic view shown in FIG. 7, it was confirmed first glass phases formed in the first open pores, second glass phases formed in the second open pores, first spaces provided in the first open pores, and second spaces provided in the first open pores. Spaces were further confirmed in the closed pores. Further, as the number of the first spaces in the first open pores opening to the main surface 11a was counted, it was proved to be zero. Further, the number of the second spaces in the second open pores opening at the main surface 1ib was proved to be 6.
Ratio of area of metal porous body in cross section of through conductor: 60 percent
Ratio (total) of areas of glass phases in cross section of through conductor: 30 percent The water-tightness of the through conductor of the thus obtained connection substrate was confirmed by the method described referring to FIG. 8.

That is, a porous plate 21 was fixed on a table 22, a dust-free paper 23 was mounted on the table 22, and a sample 24 of the ceramic substrate was mounted thereon. Water 26 was dropped on the through holes of the ceramic substrate 24, and water was sucked at minus 80 kPa as an arrow A. It was then confirmed whether water content was attached onto the dust-free paper or not.

As a result, the number of the through conductor with the leakage of liquid observed was proved to be one, with respect to 30000 counts of the through conductors provided in the single ceramic substrate.

Examples 2 to 7

Connection substrates were produced as the Example 1.
However, the ratio of the area of the metal porous body and the ratio (total) of the areas of the glass phases in the cross section of the through conductor were changed as shown in table 1. For changing these parameters, it was changed the concentration of the solid content of Ag—Pd paste, ratios of Ag, Pd and glass frit, sintering temperature, and temperatures and holding times during the melting and impregnation of the glass paste.

Then, as to the thus obtained ceramic substrates, it was measured the number of the through conductors with the leakage of liquid observed and shown in table 1, in 30000 counts of the through conductors provided a single ceramic substrate.

TABLE 1

|  | Ex. 1 | Ex. 2 | Ex. 3 | Ex. 4 | Ex. 5 | Ex. 6 | Ex. 7 | Com. Ex. 1 |
|---|---|---|---|---|---|---|---|---|
| Number of first spaces in first open pores opening at main surface 11a (counts) | 0 | 0 | 0 | 0 | 0 | 0 | 0 | 5 |
| Number of second spaces in second open pores opening at main surface 11b (counts) | 6 | 5 | 8 | 5 | 6 | 9 | 10 | 6 |
| Ratio of area of metal porous body in cross section of through conductor (%) | 60% | 70% | 30% | 65% | 65% | 40% | 30% | 60% |
| Total of ratios of areas of glass phases in cross section of through conductor (%) | 30% | 10% | 50% | 20% | 20% | 10% | 20% | 20% |
| Number of through conductors with liquid leakage observed (counts) | 1 | 3 | 5 | 3 | 1 | 7 | 10 | All |

Comparative Example 1

Ag paste was embedded into the respective through holes of the ceramic substrate same as that in the Example 1. The Ag paste used was the same as that used in the Example 1. Thereafter, the sintering was carried out at 700° C. to form the metal porous bodies in the through holes, respectively.

Then, both main faces of the ceramic substrate were subjected to precise polishing, without performing the step of printing the glass paste on the first main face of the ceramic substrate. A connection substrate was thus obtained.

The cross section of the via part of the thus produced substrate was observed to prove that spaces were uniformly remained over the whole of the via parts. That is, the respective parameters reflecting the microstructure were as follows.

Number of first spaces in first open pores opening at main surface 11a: 5 counts
Number of second spaces in second open pores opening at main surface 11b: 6 counts
Ratio of area of metal porous body in cross section of through conductor: 60 percent
Ratio (total) of areas of glass phases in cross section of through conductor: 20 percent It was then performed the water-tightness test as the Example 1. As a result, it was observed the leakage of liquid in substantially all of 30000 counts of the through conductors provided in the single ceramic substrate.

What is claimed is:

1. A connection substrate comprising a ceramic substrate comprising a through hole therein and a through conductor formed in said through hole and having a first main surface and a second main surface:

said through conductor comprising;

a metal porous body comprising a metal matrix and pores, said pores comprising first open pores communicating with said first main surface and second open pores communicating with said second main surface;

first glass phases provided in said first open pores, respectively;

second glass phases formed in said second open pores, respectively;

first spaces provided in said first open pores, respectively; and second spaces provided in said second open pores, respectively, wherein said first spaces comprise closed spaces which do not communicate with said first main surface, and wherein said second spaces comprise open spaces communicating with said second main surface.

2. The connection substrate of claim 1, wherein said metal matrix has a ratio of an area of 30 to 70 percent in a cross section of said through conductor.

3. The connection substrate of claim 1, wherein said metal porous body comprises closed pores and, said connection substrate further comprising third glass phases present in said closed pores, respectively.

4. The connection substrate of claim 1, wherein said ceramic substrate has a thickness of 25 to 150 µm and;

wherein each of said through holes has a diameter of 20 to 60 µm.

* * * * *

UNITED STATES PATENT AND TRADEMARK OFFICE
CERTIFICATE OF CORRECTION

PATENT NO. : 10,257,941 B2
APPLICATION NO. : 16/108339
DATED : April 9, 2019
INVENTOR(S) : Sugio Miyazawa et al.

Page 1 of 1

It is certified that error appears in the above-identified patent and that said Letters Patent is hereby corrected as shown below:

On the Title Page

The "Foreign Application Priority Data" is missing. Please insert item (30) to read as follows:
--(30) Foreign Application Priority Data
March 11, 2016 (JP) . . . . . 2016-048165--

Signed and Sealed this
Twenty-fifth Day of June, 2019

Andrei Iancu
*Director of the United States Patent and Trademark Office*